(12) United States Patent
Cheong et al.

(10) Patent No.: US 6,521,508 B1
(45) Date of Patent: Feb. 18, 2003

(54) METHOD OF MANUFACTURING A CONTACT PLUG IN A SEMICONDUCTOR DEVICE USING SELECTIVE EPITAXIAL GROWTH OF SILICON PROCESS

(75) Inventors: Woo Seock Cheong, Ichon-Shi (KR); Eui Beom Roh, Suwon-Shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 61 days.

(21) Appl. No.: 09/721,938

(22) Filed: Nov. 27, 2000

(30) Foreign Application Priority Data

Dec. 31, 1999 (KR) .............................. 99-68099

(51) Int. Cl.⁷ .............................................. H01L 21/76
(52) U.S. Cl. .................... 438/416; 438/418; 438/269; 438/523; 438/524; 438/597; 438/607; 438/637; 438/641; 438/672; 438/674; 438/675; 438/684
(58) Field of Search ................................ 438/416, 418, 438/269, 523, 524, 597, 607, 637, 641, 672, 674, 675, 684

(56) References Cited

U.S. PATENT DOCUMENTS

| | | | |
|---|---|---|---|
| 4,728,623 A | 3/1988 | Lu et al. ........................ 437/52 |
| 4,738,937 A | 4/1988 | Parsons ...................... 437/180 |
| 4,918,029 A | 4/1990 | Kim ............................ 437/119 |
| 5,004,702 A | 4/1991 | Samata et al. ................ 437/57 |
| 5,030,583 A | 7/1991 | Beetz .......................... 437/39 |
| 5,032,538 A | 7/1991 | Bozler et al. ................. 437/83 |
| 5,045,494 A | 9/1991 | Choi et al. .................... 437/60 |
| 5,047,367 A * | 9/1991 | Wei et al. .................... 437/200 |
| 5,272,109 A | 12/1993 | Motoda ....................... 437/129 |
| 5,322,802 A | 6/1994 | Baliga et al. ................. 437/22 |
| 5,322,814 A | 6/1994 | Rouse et al. ................. 437/110 |
| 5,340,754 A * | 8/1994 | Witek et al. .................. 437/49 |
| 5,378,652 A | 1/1995 | Samata et al. .............. 437/189 |
| 5,393,681 A * | 2/1995 | Witek et al. ................. 437/162 |
| 5,432,121 A | 7/1995 | Chan et al. .................... 437/95 |
| 5,435,856 A | 7/1995 | Rouse et al. ................. 136/225 |
| 5,494,837 A | 2/1996 | Subramanian et al. ......... 437/34 |
| 5,508,225 A | 4/1996 | Kadoiwa .................... 437/129 |
| 5,527,723 A * | 6/1996 | Witek et al. ................... 437/40 |

(List continued on next page.)

FOREIGN PATENT DOCUMENTS

| | | |
|---|---|---|
| JP | 54-158880 | 12/1979 |
| JP | 2-37745 | 2/1990 |
| JP | 2-260667 | 10/1990 |
| JP | 8-236728 | 9/1996 |
| JP | 10-107219 | 4/1998 |
| JP | 11-97519 | 4/1999 |

*Primary Examiner*—John F. Niebling
*Assistant Examiner*—Lynne A. Gurley
(74) *Attorney, Agent, or Firm*—Finnegan, Henderson, Farabow, Garrett & Dunner, L.L.P.

(57) ABSTRACT

There is disclosed a method of manufacturing a contact plug in a semiconductor device using selective epitaxial growth of silicon (SEG) process. The method includes forming a nitride film at a predetermined in a semiconductor substrate region except for the region in which a contact plug will be formed, forming an USG film on the entire surface of the substrate in which the nitride film is formed by chemical enhanced vapor deposition method or a plasma method, etching the USG film by reactive ion etch method to expose the surface of silicon in the structure, and forming a contact plug by performing in-situ process while performing selective epitaxial growth method for the silicon film exposed through the contact hole in the structure. Therefore, the present invention can significantly increase selectivity of a nitride film by an USG film on a nitride film pattern during SEG process to minimize detects due to thermal stress of the nitride film and formation of facets, thus increasing the process margin of the contact plug.

10 Claims, 2 Drawing Sheets

U.S. PATENT DOCUMENTS

| | | | |
|---|---|---|---|
| 5,567,652 A | 10/1996 | Nishio | 437/200 |
| 5,599,724 A | 2/1997 | Yoshida | 437/40 |
| 5,627,102 A | 5/1997 | Shinriki et al. | 437/192 |
| 5,627,395 A * | 5/1997 | Witek et al. | 257/350 |
| 5,633,201 A | 5/1997 | Choi | 438/620 |
| 5,744,377 A | 4/1998 | Sekiguchi et al. | 438/674 |
| 5,753,555 A * | 5/1998 | Hada | 438/300 |
| 5,773,350 A * | 6/1998 | Herbert et al. | 438/364 |
| 5,804,470 A | 9/1998 | Wollesen | 438/141 |
| 6,180,453 B1 * | 1/2001 | Sung et al. | 438/256 |
| 6,235,575 B1 * | 5/2001 | Kasai et al. | 438/242 |
| 6,248,643 B1 * | 6/2001 | Hsieh et al. | 438/424 |
| 6,306,723 B1 * | 10/2001 | Chen et al. | 438/429 |
| 2002/0031916 A1 * | 3/2002 | Ohkubo et al. | 438/758 |

* cited by examiner

METHOD OF MANUFACTURING A CONTACT PLUG IN A SEMICONDUCTOR DEVICE USING SELECTIVE EPITAXIAL GROWTH OF SILICON PROCESS

BACKGROUND OF THE INVENTION

1. Field of the Invention

The invention relates generally to a method of manufacturing a semiconductor device. More particularly, the present invention relates to a method of manufacturing a contact plug in a semiconductor device using selective epitaxial growth of silicon (hereinafter called "SEG") process in a high-integration semiconductor device.

2. Description of the Prior Art

It is said that a SEC technology is highly evaluated in view of reduction in a cell size and simplification in a manufacturing process.

A contact plug of a conventional SAC (self-aligned contact) method is formed in such a manner that doped silicon is deposited in a contact hole and is polished, and polysilicon is separated by chemical mechanical polishing (CMP) process.

However, formation of the contact plug by this SAC method has a manufacturing problem in implementing a contact hole having a high aspect ratio in a device technology of below 0.16 $\mu$m. More particularly, the conventional process of manufacturing a contact plug usually includes performing CMP process for flattening the surface of an interlayer insulating film, forming a contact plug, depositing doped polysilicon and then performing CMP process again. That is, there is a problem that the conventional process must perform twice CMP process that is expensive in the unit price in process. Also, when CMP process and etching of the contact hole are performed, the hard mask and the spacer functioning as an etch barrier on the gate electrode usually employs an oxide material of the interlayer insulating film and a nitride material having an etch selectivity. At this time, though the thickness of the nitride film must be increased to sufficiently act as an etch barrier, it is difficult to control the etching uniformity of the contact by reactive ion etching (hereinafter called "RIE") since the aspect ratio is increased when the contact hole is manufactured.

Recently, a method of manufacturing a contact plug using SEC has been developed as one method of reducing CMP process while solving the drawback in the conventional contact plug.

Thus, by forming the contact plug using SEG, the height of the hard mask nitride film acting as a barrier can be reduced. Also, as the polishing process for an interlayer insulating film can be performed at the height of the gate electrodes the aspect ratio of the contact plug for the plug can be lowered, thus improving stability in forming the contact plug in SAC process. Additionally, as the silicon polishing process can be omitted, simplification of process can be obtained.

Though, in case of using LPCVD method using SEG, there are some problems that must be solved.

One of them is to secure selectivity depending on a pattern material (i.e., material forming a window so that SEG can be grown). Generally, SEG can be significantly varied depending on selectivity, defects due to thermal stress, shape of facet formation, etc. In other words, in case that the nitride film is used as the pattern material in the SEG process, it is difficult to secure selectivity for silicon below 800° C.

Also, as the thermal coefficient of expansion (TCE) of the nitride film is much higher than that of silicon, there is a problem that creation of SEG defects depending on variation in the temperature could not be prohibited.

Additionally, when doping such as P is performed in-situ during SEG process, there is a problem that the speed of SEG is reduced since securing of selectivity is difficult. Also, if the sidewall of the contact hole is formed of a nitride material, there is a problem that a corner filling is weakened since facet (54°) of (111) phase is grown.

SUMMARY OF THE INVENTION

It is therefore an object of the present invention to provide a method of manufacturing a semiconductor device using SEG process capable of reducing generation of defects during a manufacturing process of SEG, by depositing an oxide film of a plasma type having a good step coverage on a nitride film, implementing RIE and cleaning process and then performing SEG process so that selectivity and a process margin for the nitride film acting as an etch barrier can be secured when a contact plug is formed using SEG process.

In order to accomplish the above object, a method of manufacturing a contact plug in a semiconductor device using SEG process according to the present invention is characterized in that it comprises the steps of forming a nitride film at a predetermined in a semiconductor substrate region except for the region in which a contact plug will be formed; forming an USG film on the entire surface of the substrate in which the nitride film is formed by chemical enhanced vapor deposition method of a plasma method; etching the USG film by reactive ion etch method to expose the surface of silicon in the structure; and forming a contact plug by performing in-situ process while performing selective epitaxial growth method for the silicon film exposed through the contact hole in the structure.

According to the present invention, if a pattern layer being an underlying structure in a contact hole having a high aspect ratio in a high integration semiconductor device is a nitride film, a shallow USG film is formed on its surface by plasma method to thus significantly increase selectivity of the nitride film during SEG process. Thereby, it can reduce defects caused by thermal stress and formation of facets in the nitride during SEC process to increase a plug process margin.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Referring now to FIGS. 1A to 1D, a method of manufacturing a contact plug in a semiconductor device using SEC process according to one embodiment of the present invention will be below explained in detail.

Figure 1A:
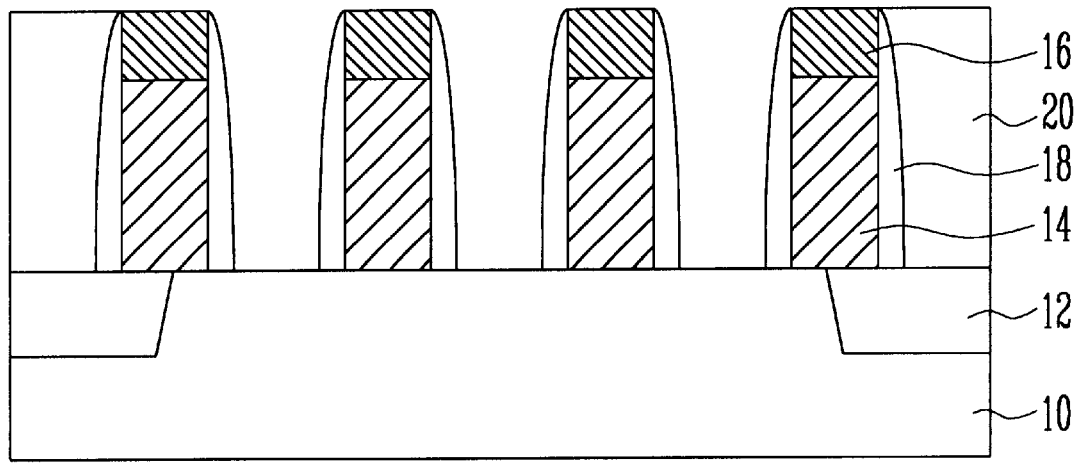
FIGS. 1A to 1D are flowcharts for explaining a method of manufacturing a contact plug in a semiconductor device using SEG process according to one embodiment of the present invention.

First, as shown in FIG. 1A, a nitride film is formed at a predetermined region in a silicon substrate 10 as a semiconductor substrate, in which at contact plug will be formed. In the present embodiment, the portion in which the nitride film will he formed is a hard mask and a spacer on a gate electrode.

Then, a general MOS transistor as a semiconductor device is formed on the silicon substrate 10 in which a field oxide film 12 is formed. Next, a gate electrode 14 made of a conductive layer and a hard mask pattern 16 are sequentially formed on the substrate. Then, a spacer 18 being an insulating material, for example, nitride is formed at the sidewalls of the hard mask pattern 16 and the gate electrode 14. Thereafter, a conductive type impurity is ion-implanted into the substrate between the spacers to form a source/drain region (not shown).

Then, an interlayer insulating film 20 except for the predetermined portion in which the contact plug will be formed in the substrate in which the MOS transistor is formed, is buried using SAC method, and its surface is then polished by CMP. Thus, a window or a contact hole is formed between the spacers 18 in the substrate in which the contact plug of the MOS transistor will be formed.

Figure 1B:
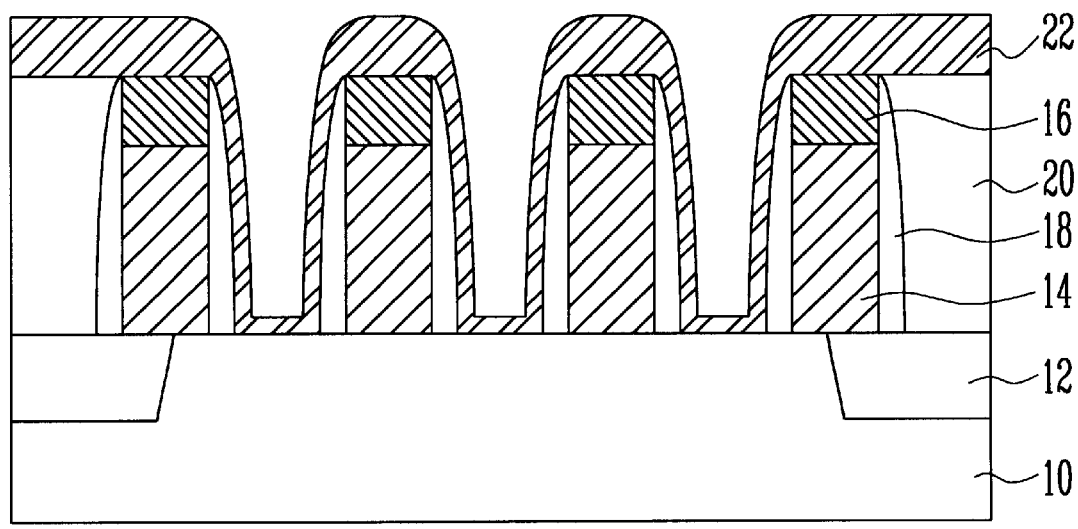

Thereafter, as shown in FIG. 1B, an undoped silicate glass (USC,) film 22 is formed by means of chemical enhanced chemical vapor deposition of a plasma method in order to increase selectivity of the hard mask 16 and the spacer 18 which are made of a nitride material according to the present invention. At this time, when the USC film 22 is formed, $SiH_4$ or $Si(OC_2H_5)_4$ and $N_2O$ or $O_2$ gas are used as a silicon source gas, wherein the silicon source gas is supplied with 10 sccm ~50 sccm and $N_2O$ or $O_2$ gas is supplied with 1000 sccm ~5000 sccm. At this time, the process is performed under the pressure of 1 torr~10 torr and the power of 100 W~500 W at the temperature of 450~550° C.

That is, the present invention deposits an oxide film on the nitride films 16 and 18 such as the hard mask and the spacers using chemical enhanced vapor deposition method of a plasma method during SAC process in order to reduce SEG process margin and thermal defects. At this time, the oxide film uses USG having a high step coverage of about 30%~50% not TEOS having a poor step coverage. Thus, the USG film 22 can compensate for loss of USG to be removed during a subsequent process to be implemented under the condition of RIE and ex-situ cleaning since it has a high step coverage characteristic.

Also, in a device technology of below 0.16 µm, if the aspect ratio is more than 4 (four), the thickness of the USG film deposited on the sidewalls of the contact hole is lower than that deposited on the bottom of the contact hole. In order to reduce this thickness difference, the following RIE process is implemented.

Figure 1C:
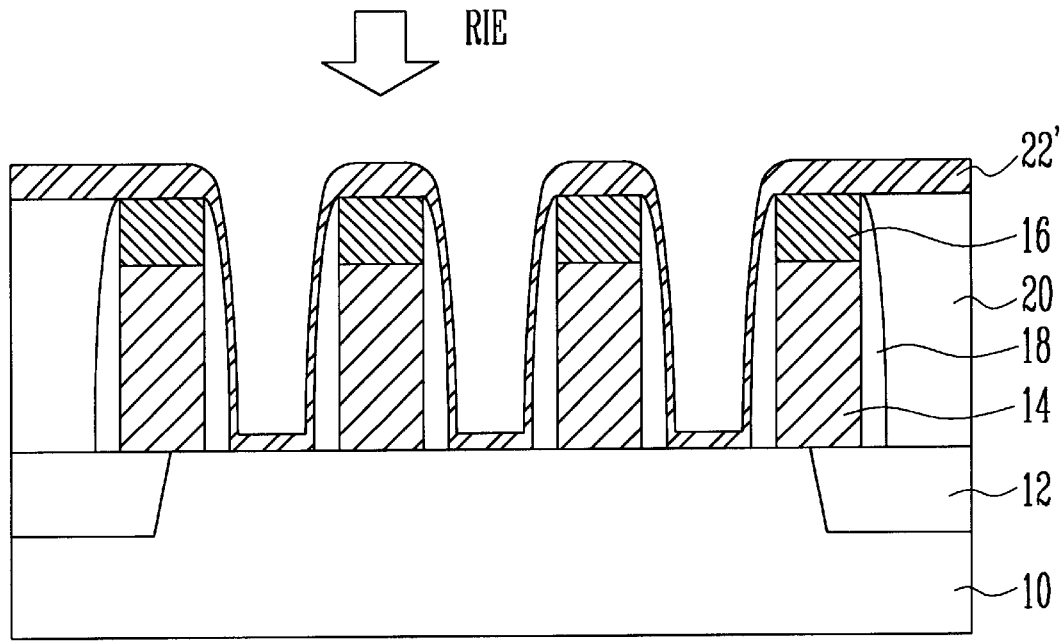

As shown in FIG. 1C, the USG film 22 is etched by RIE method so that the surface of the silicon substrate overlying the contact hole portion can be exposed. Here, RIE must consider the aspect ratio of the contact hole for forming a plug. Thus, the RIE conditions are as follows: the pressure is 100 mtorr~1 torr, the power is 400 W~1000 W, a bias power is 300 W~600 W, and $CHF_3$, $O_2$ and Ar are supplied with 20~50 sccm, 5 sccm~30 sccm and 500 sccm~1000 sccm, respectively, as reactive gases at room temperature. Also, the process time of RIE is the time while the USG film existing on the bottom of the contact hole is removed. At this time, the etch rate of the USG film existing on the sidewalls of the contact hole is controlled to be below 20%.

Next, before SEG process is implemented, ex-situ cleaning process is additionally performed in order to remove the USG film remaining in the contact hole while minimizing loss of USG. At this time, the ex-situ cleaning process is performed over first and second processes. Then, the first cleaning process is performed at the temperature of 100~130° C. for 3 minutes~10 minutes using a as mixture aqueous solution of $H_2SO_4$ and $H_2O_2$ at the ratio of 3:1~4:1, thus removing a carbon contaminant material. Also, the second cleaning process is performed at the temperature of 50~100° C. using a 50:1~100:1 HF solution, thus removing the USG film remaining on the surface of the substrate. At this time, the time of the second cleaning process is the time when etch loss of the USC film becomes up to 70~80 Å. The reason is that the USG film on the hard mask is etched about twice than the USG film on the spacer when etch loss of the USG film becomes up to 70~80 Åsince the etch speed is different depending on the positions of the USG film since the ex-situ cleaning etch speed is different depending on the pattern shape and the stress by RIE. Therefore, the USG film 22' that is blanket-etched through the RIE process has a significantly reduced difference in thickness at the flattened portion (for example, portion of the hard mask) and the sides of the contact hole (for example, spacers).

Figure 1D:
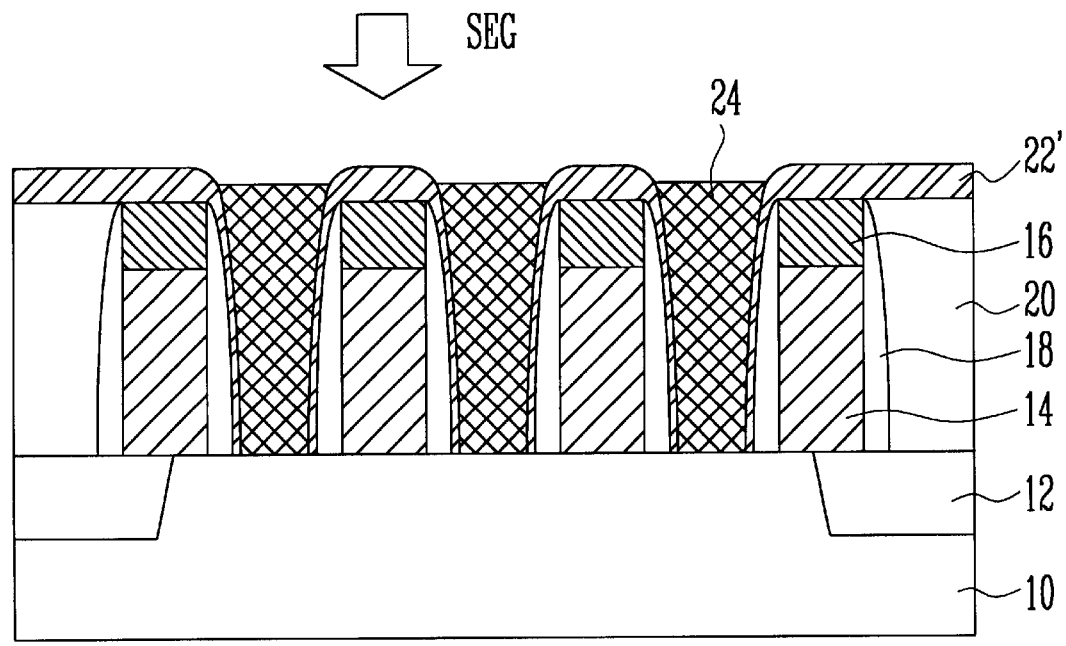

Then, as shown in FIG. 1D, doping process is performed while SEG process is performed for the silicon substrate exposed through the contact hole of the structure. thereby forming a contact plug 24 in which silicon is selectively grown.

At this time, the SEG process employs a low-pressure chemical vapor deposition method. Also, the condition when the SEG process is performed using $SiH_2Cl_2$~$H_2$~HCl system is as follows: the temperature is 750~850° C., the pressure is 5~100 torr, and 0.1 sccm~1 sccm of $SiH_2Cl_2$, 30 slm~150 slm of $H_2$ and 0 sccm~1.0 sccm of HCl are supplied. On the contrary, the condition when the SEG process is performed using $SiH_4$~$H_2$~HCl system is as follows; the temperature is 750~850° C., the pressure is 5~100 torr, and 0.1 sccm~1 sccm of $SiH_4$, 30 slm~150 slm of $H_2$ and 0.5 sccm~5.0 sccm of HCl are supplied.

Also, in-situ doping process is performed by supplying 0.1 slm~0.5 slm of 1%~5%$PH_3/H_2$.

As such, the present invention can increase the speed of the SEG process by reducing the amount of introduced HCl gas even though the doping such as P is performed in-situ during the SEG process. Also, the USG film prevents from causing a facet (54°) due to a nitride material on the sidewall of the contact hole, so that SEG can be stably filled into the corner of the contact hole.

Meanwhile, though the above embodiment explained a method of manufacturing a contact plug in a semiconductor device using a material layer pattern made of nitride as a hard mask and a spacer on the sides of a gate electrode, it may be applied to the case that the material film itself is formed of a nitride film without any spacers and that the window between the material film pattern is a contact hole for connecting upper and bottom wiring layers or an upper wiring layer and a semiconductor substrate.

As mentioned above, the present invention forms a shallow USG film on the surface of a SAC pattern (nitride) using a good step coverage property of PE-CVD film. Thus, the present invention has the following effects:

First, it can improve selectivity upon SEG process.

Second, it can increase the speed of SEG growth. This is because the amount of introduced HCl is reduced in order to increase its selectivity.

Third, it can reduce any generation of defects upon SEG process. That is, the nitride film and the USG film have opposite thermal coefficient of expansion for silicon. For example, as the nitride material on the sidewall of the contact hole tends to cause facet (54°) or (111) phase but USG acts to prohibit generation of facet, a double film made of them can offset thermal coefficient of expansion, thus stably forming SEG at the corner of the contact hole.

Fourth, it can simplify process without performing silicon polish process such as in the conventional process of forming a contact plug and can improve stability of SAC process by lowering the height of a nitride film for a hard mask.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A method of manufacturing a contact plug in a semiconductor device using a selective epitaxial growth of silicon (SEG) process, comprising the steps of:

forming a nitride film at a predetermined location in a semiconductor substrate region except for a region in which a contact plug will be formed;

forming an undoped silicon glass (USG) film by a chemical enhanced vapor deposition method of a plasma method on the entire surface of the substrate in which said nitride film is formed;

etching said USG film by a reactive ion etch method to expose a surface in said structure; and forming a contact plug by performing an in-situ doping process while performing selective epitaxial growth method for silicon exposed through the contact hole in the structure.

2. The method of manufacturing a contact plug in a semiconductor device using an SEG process according to claim 1, wherein the formation of said USG film is performed using a silicon source gas and $N_2O$ gas or $O_2$ gas, wherein the silicon source gas is implanted with 10 sccm~50 sccm and $N_2O$ or $O_2$ gas is implanted with 1000 sccm~5000 sccm, under a pressure of 1 torr~10 torr and a power of 100W~500 W at a temperature of 450~550° C.

3. The method of manufacturing a contact plug in a semiconductor device using an SEG process according to claim 1, wherein the conditions for said reactive ion etch method include: a pressure of 100 mtorr~1 torr, an RF power of 400 W ~1000 W, a bias power of 300 W~600 W, and $CHF_3$, $O_2$ and Ar being supplied with 20~50 sccm, 5 sccm~30 sccm and 500 sccm~1000 sccm, respectively, as reactive gases at room temperature.

4. The method of manufacturing a contact plug in a semiconductor device using an SEG process according to claim 1, wherein before said selective epitaxial growth process is performed, an ex-situ cleaning process is performed.

5. The method of manufacturing a contact plug in a semiconductor device using an SEG process according to claim 4, wherein said ex-situ cleaning process is performed over first and second cleaning processes, wherein said first cleaning process is performed at a temperature of 100~130° C. for 3~10 minutes using an aqueous solution mixture of $H_2SO_4$ and $H_2O_2$ in a ratio of 3:1~4:1 and said second cleaning process is performed at a temperature of 50~100° C. using a 50:1~100:1 HF solution.

6. The method of manufacturing a contact plug in a semiconductor device using an SEG process according to claim 5, wherein a time of said second cleaning process is the time for etch loss of said USG film to become up to 70~80 Å.

7. The method of manufacturing a contact plug in a semiconductor device using an SEG process according to claim 1, wherein a selective epitaxial growth process when said contact plug is formed uses a low-pressure chemical vapor deposition method.

8. The method of manufacturing a contact plug in a semiconductor device using an SEG process according to claim 1, wherein a selective epitaxial growth process when said contact plug is formed employs a $SiH_2Cl_2$-$H_2$-HCl system under the following conditions: a temperature of 750~850° C., a pressure of 5~100 torr, and 0.1 sccm~1 sccm of $SiH_2Cl_2$, 30 slm~150 slm of $H_2$ and 0 sccm~1.0 sccm of HCl being supplied.

9. The method of manufacturing a contact plug in a semiconductor device using an SEG process according to claim 1, wherein a selective epitaxial process when said contact plug is formed employs a $SiH_4$-$H_2$-HCl system under the following conditions: a temperature of 750~850° C., a pressure of 5~100 torr, and 0.1 sccm~1 sccm of $SiH_4$, 30 slm~150 slm of $H_2$ and 0.5 sscm 5.0 sccm of HCl being supplied.

10. The method of manufacturing a contact plug in a semiconductor device using an SEG process according to claim 1, wherein the in-situ doping process, when said contact plug is formed, supplies 0.1 slm~0.5 slm of 1%~5%$PH_3/H_2$.

* * * * *

UNITED STATES PATENT AND TRADEMARK OFFICE
CERTIFICATE OF CORRECTION

PATENT NO. : 6,521,508 B1
DATED : February 18, 2003
INVENTOR(S) : Woo Seock Cheong et al.

It is certified that error appears in the above-identified patent and that said Letters Patent is hereby corrected as shown below:

Title page,
Item [57], delete the ABSTRACT in its entirety and insert therefor -- A method of manufacturing a contact plug in a semiconductor device using a selective epitaxial growth of silicon (SEG) process includes forming a nitride film at a predetermined location in a semiconductor substrate region except for a region in which a contact plug will be formed, forming a USG film by chemical enhanced vapor deposition method of a plasma method on the entire surface of the substrate in which the nitride film is formed, etching the USG film by a reactive ion etch method to expose the surface of silicon in the structure, and forming a contact plug by performing an insitu process while performing the selective epitaxial growth method of the silicon film exposed through the contact hole in the structure. The method can significantly increase selectivity of a nitride film by USG film on a nitride film pattern during an SEG process to minimize defects due to thermal stress of the nitride film and formation of facets, thus increasing the process margin of the contact plug. --

Column 6,
Line 42, "0.5 sscm 5.0 sccm" should read -- 0.5sccm ~ 5.0sccm --.

Signed and Sealed this

Ninth Day of September, 2003

JAMES E. ROGAN
*Director of the United States Patent and Trademark Office*